(12) United States Patent
Lee

(10) Patent No.: US 12,720,686 B2
(45) Date of Patent: Aug. 25, 2026

(54) RIGID-FLEXIBLE PRINTED CIRCUIT BOARD AND PREPARATION METHOD THEREFOR

(71) Applicant: TRIPLE WIN TECHNOLOGY(SHENZHEN) CO. LTD., Shenzhen (CN)

(72) Inventor: Yun-Yen Lee, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 201 days.

(21) Appl. No.: 18/659,784

(22) Filed: May 9, 2024

(65) Prior Publication Data

US 2025/0220825 A1 Jul. 3, 2025

(30) Foreign Application Priority Data

Dec. 29, 2023 (CN) ........................ 202311870207.X

(51) Int. Cl.
*H05K 3/46* (2006.01)
*H05K 1/03* (2006.01)
*H05K 3/28* (2006.01)

(52) U.S. Cl.
CPC ........... *H05K 3/4691* (2013.01); *H05K 1/036* (2013.01); *H05K 3/28* (2013.01)

(58) Field of Classification Search
CPC H05K 1/036; H05K 1/14; H05K 3/28; H05K 3/4611; H05K 3/4691
See application file for complete search history.

(56) References Cited

U.S. PATENT DOCUMENTS

2010/0065313 A1* 3/2010 Takeuchi ............. H05K 1/0278 174/258
2011/0194262 A1* 8/2011 Naganuma ........... H05K 3/4691 174/254
2011/0198111 A1* 8/2011 Naganuma ........... H05K 3/4691 174/254
2011/0199739 A1* 8/2011 Naganuma ........... H05K 3/4691 29/829
2012/0097326 A1* 4/2012 Wang ................... H05K 3/4691 156/257
2017/0196077 A1* 7/2017 Iriguchi ............... H05K 3/4691

* cited by examiner

*Primary Examiner* — Nathan Milakovich
(74) *Attorney, Agent, or Firm* — ScienBiziP, P.C.

(57) ABSTRACT

A preparation method for a rigid-flexible printed circuit board involves initially providing a flexible board, divided into two regions along its extension direction. A first protective layer is applied to the flexible board, with distinct parts covering the two regions respectively. Subsequently, a rigid board is positioned in the second region, designed with a notch to alleviate height discrepancies introduced by the protective layer. The final step involves laminating the rigid board to the flexible board. This ensures the portion of the rigid board adjacent to the second portion is aligned flush with the rest, resulting in a rigid-flex PCB with improved flatness. This method is particularly significant for applications requiring precise structural integrity and consistency in electronic devices.

18 Claims, 10 Drawing Sheets

RIGID-FLEXIBLE PRINTED CIRCUIT BOARD AND PREPARATION METHOD THEREFOR

FIELD

The subject matter herein generally relates to the field of circuit boards, and more particularly, to a rigid-flexible printed circuit board and a preparation method for the rigid-flexible printed circuit board.

BACKGROUND

Rigid-flexible printed circuit boards (PCBs) may include a flexible board and a rigid board formed on a portion of the flexible board. The flexible board exposed from the rigid board forms a flexible area with good flexibility. During the manufacturing of the rigid-flexible PCBs, a cover layer covers and protects circuits in the flexible area. To prevent the cover layer from separating from the flexible area, the cover layer may extend toward the rigid area.

However, after laminating the rigid board on the rigid area of the flexible area, the outer surface of the final PCB may become uneven caused by the extended portion of the cover layer. This unevenness may affect the performance and the reliability of the PCB.

BRIEF DESCRIPTION OF THE DRAWINGS

Implementations of the present technology will now be described, by way of example only, with reference to the attached figures.

DETAILED DESCRIPTION

Figure 1:
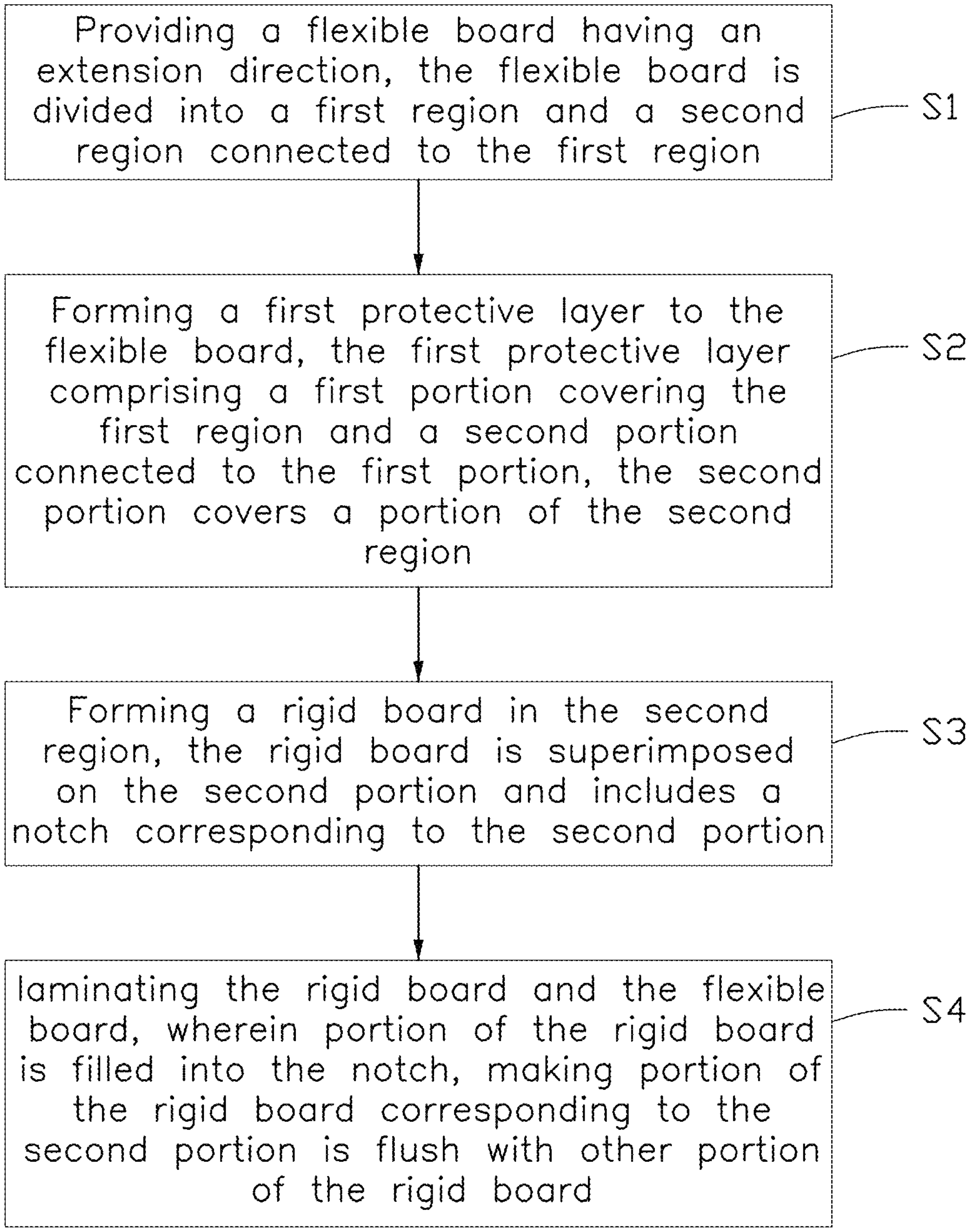
FIG. 1 is a flowchart of a preparation method for a rigid-flexible printed circuit board according to an embodiment of the present application.

It will be appreciated that for simplicity and clarity of illustration, where appropriate, reference numerals have been repeated among the different figures to indicate corresponding or analogous members. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term “comprising,” when utilized, means “including, but not necessarily limited to;” it specifically indicates open-ended inclusion or membership in the so-described combination, group, series, and the like.

Referring to FIG. 1, an embodiment of the present application provides preparation method for a rigid-flexible printed circuit board 100 (hereinafter, refer as rigid-flexible PCB 100). The method is provided by way of example, as there are a variety of ways to carry out the method. Each block shown in FIG. 1 represents one or more processes, methods, or subroutines, carried out in the example method. Furthermore, the illustrated order of blocks is illustrative only and the order of the blocks can change. Additional blocks can be added or fewer blocks may be utilized or the order of the blocks may be changed, without departing from this disclosure. The method can begin at block S1.

Figure 2:
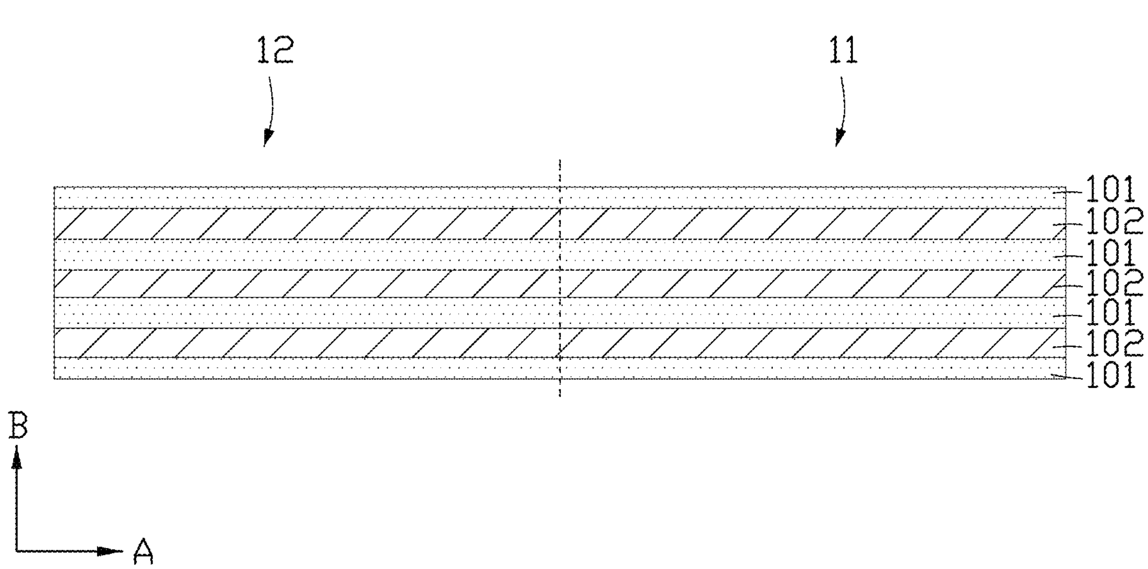
FIG. 2 is a cross-sectional view of a flexible board according to an embodiment of the present application.

Block S1, referring to FIG. 2, a flexible board 10 is provided. The flexible board 10 defines an extension direction A. Along the extension direction A, the flexible board 10 is divided into a first region 11 and a second region 12 connected to the first region 11.

In this embodiment, the flexible board 10 can be bent, wound, or folded without damaging. Circuits can be arranged in the flexible board 10 according to spatial layout requirements. The flexible board 10 further defines a thickness direction B. The thickness direction B is perpendicular to the extension direction A. Along the thickness direction B, the flexible board 10 includes a plurality of internal conductive layers 101 and a plurality of internal insulating layers 102. The internal insulating layers 102 are spaced apart from each other. Each of the internal conductive layers 101 is located between two adjacent insulating layers 102. The internal insulating layers 102 are made of resin selected from polyimide (PI), polyester (PET), or polytetrafluoroethylene (PTFE).

Figure 3:
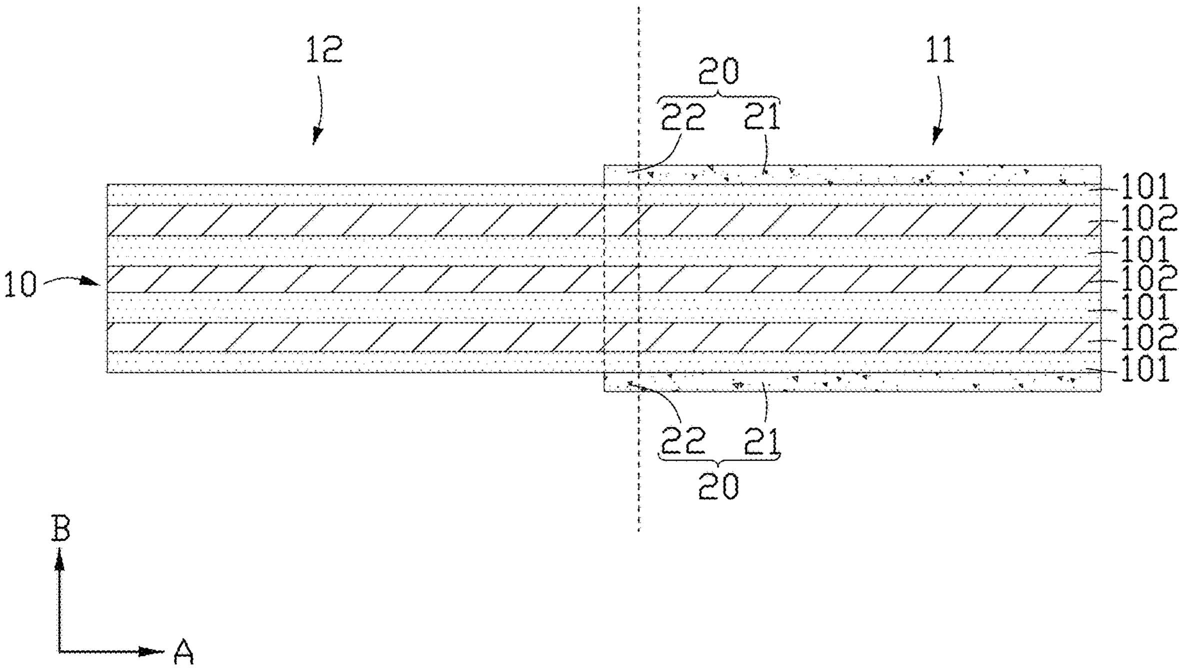
FIG. 3 is a cross-sectional view showing a first protective layer being formed on the flexible board of FIG. 2.

Block S2, referring to FIG. 3, a first protective layer 20 is formed the flexible board 10. The first protective layer 20 includes a first portion 21 and a second portion 22 connected to the first portion 21. The first portion 21 covers the first region 11, and the second portion 22 partially covers the second region 12. The first protective layer 20 is made of resin selected from polyimide (PI), polyester (PET), liquid photo-imageable coverlay (LPIC), or polytetrafluoroethylene (PTFE). The first protective layer 20 can protect the internal conductive layers 101 of the flexible board 10 from physical damage and chemical corrosion, while also providing electrical insulation function.

In this embodiment, the first protective layer 20 is formed on both surfaces of the flexible board 10, and the second portion 22 of each first protective layer 20 partially covers the second region 12.

Figure 4:
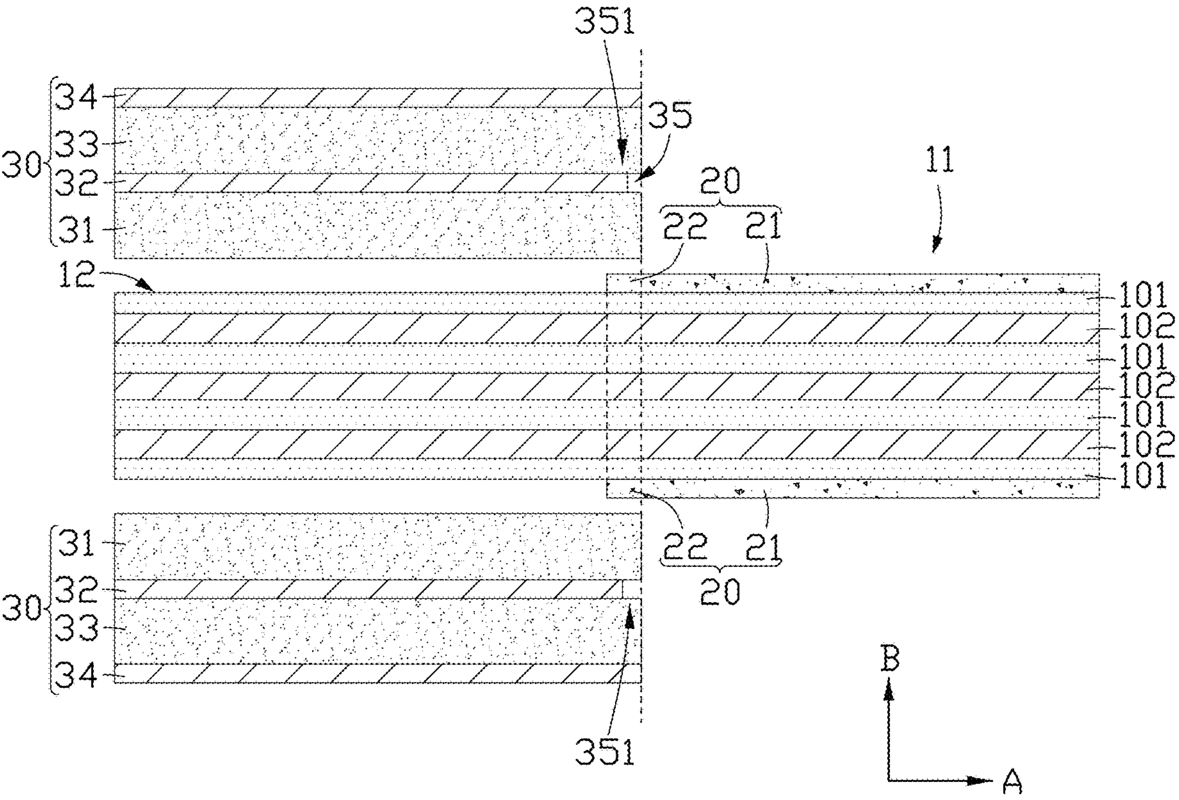
FIG. 4 is a cross-sectional view showing a rigid board being formed on the flexible board of FIG. 3.

Block S3, referring to FIG. 4, a rigid board 30 is formed on the second region 12. The rigid board 30 defines a notch 35. The notch 35 corresponds to the second portion 22 in the thickness direction B. The rigid board 30 includes a first insulating layer 31, a first conductive layer 32, a second insulating layer 33, and a second conductive layer 34. The first insulating layer 31, the first conductive layer 32, the second insulating layer 33, and the second conductive layer 34 are successively stacked in the thickness direction B. The first insulating layer 31 is formed on the second region 12. The first insulating layer 31 and the second insulating layers 33 are fiberglass epoxy resin board, polytetrafluoroethylene board, or ceramic substrate.

In at least one embodiment, the notch 35 includes a first notch 351 defined at the first conductive layer 32. The first notch 351 extends through the first conductive layer 32 along the thickness direction B for partially exposing the first insulating layer 31 and the second insulating layers 33. In this embodiment, each of the rigid boards 30 is provided with the first notch 351 in the first conductive layer 32.

Figure 5:
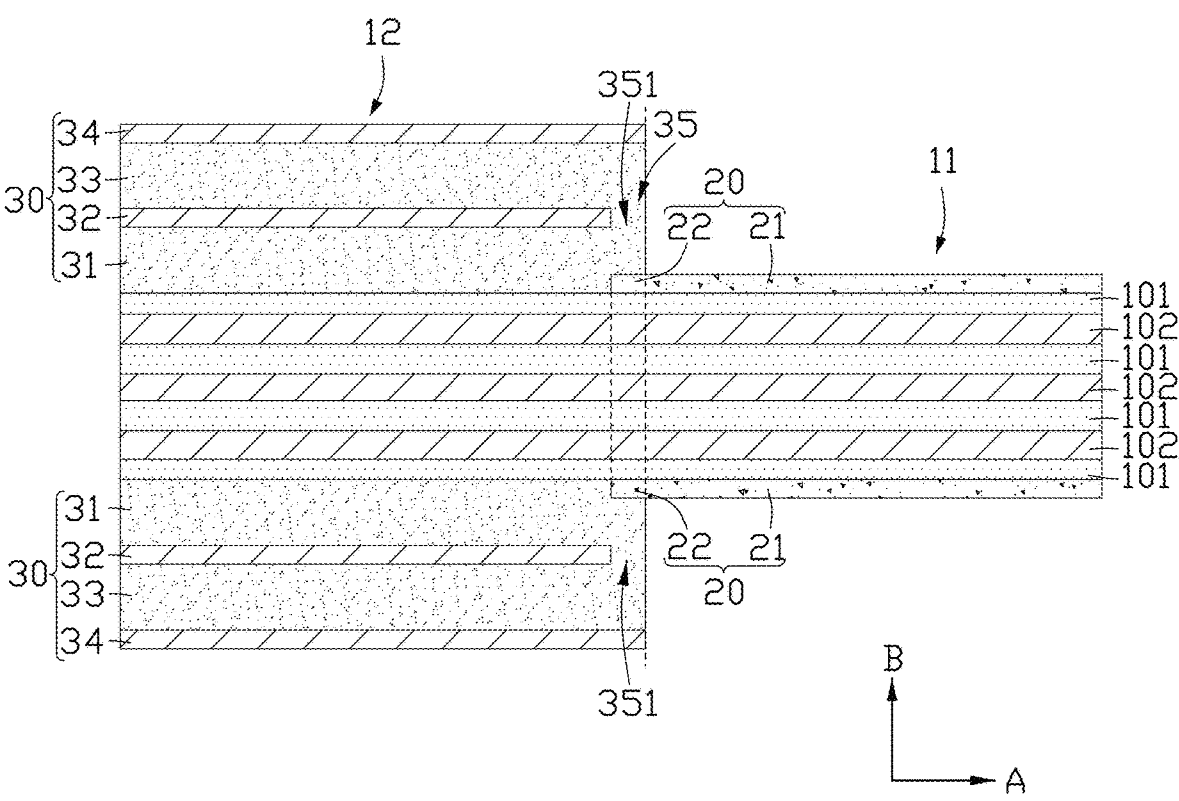
FIG. 5 is a cross-sectional view showing the rigid board being laminated on the flexible board of FIG. 4.

Block S4, referring to FIG. 5, the rigid board 30 and the flexible board 10 are laminated together so that the portion of the rigid board 30 corresponding to the second portion 22 is flush with the other portions of the rigid board 30, resulting in the rigid-flex PCB 100.

In this embodiment, when laminating the rigid board 30 and the flexible board 10, a portion of the first insulating layer 31 and/or the second insulating layer 33 are filled into the first notch 351, thereby reducing warping and deformation of the rigid board 30.

Figure 7:
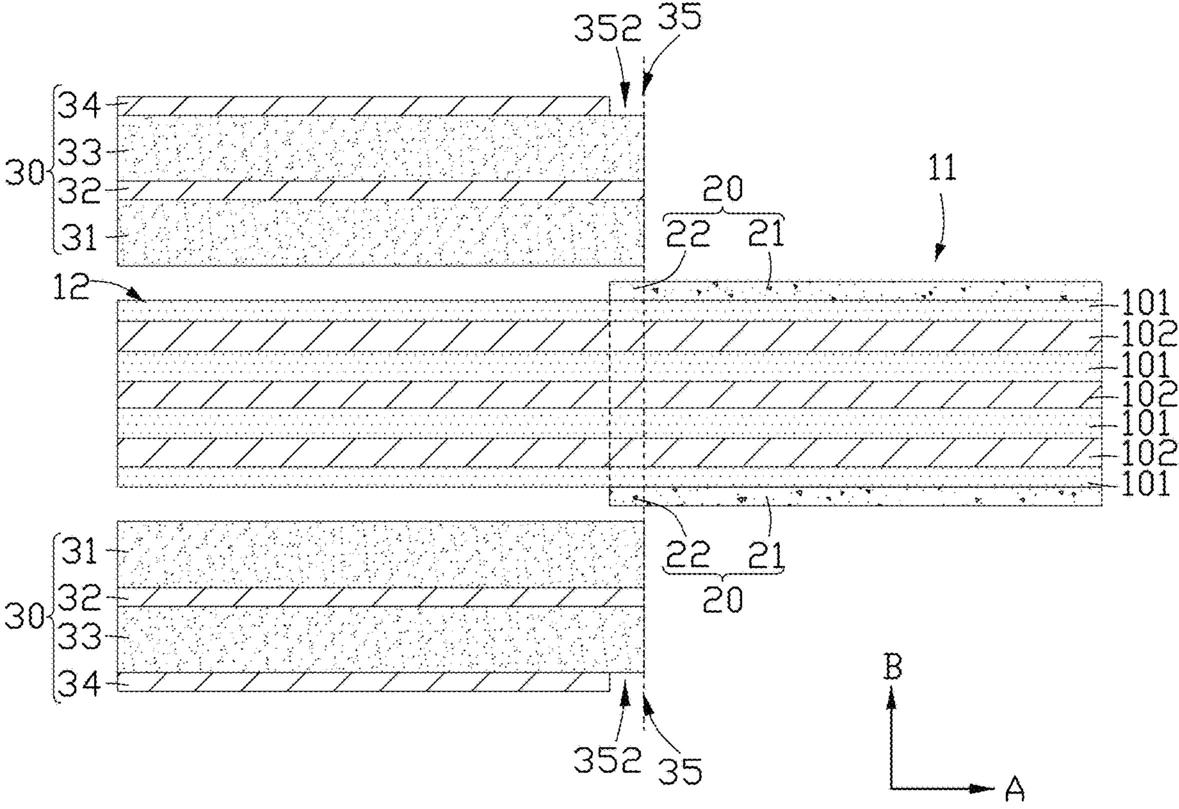
FIG. 7 is a cross-sectional view showing a rigid board being formed on the flexible board according to another embodiment of the present application.

In another embodiment of the present application, referring to FIG. 7, the notch 35 includes a second notch 352 defined at the second conductive layer 34. The second notch 352 extends through the second conductive layer 34 along the thickness direction B, and a portion of the second insulating layer 33 is exposed from the second notch 352. Each of the rigid boards 30 is provided with the second notch 352 in the first conductive layers 32.

Figure 8:
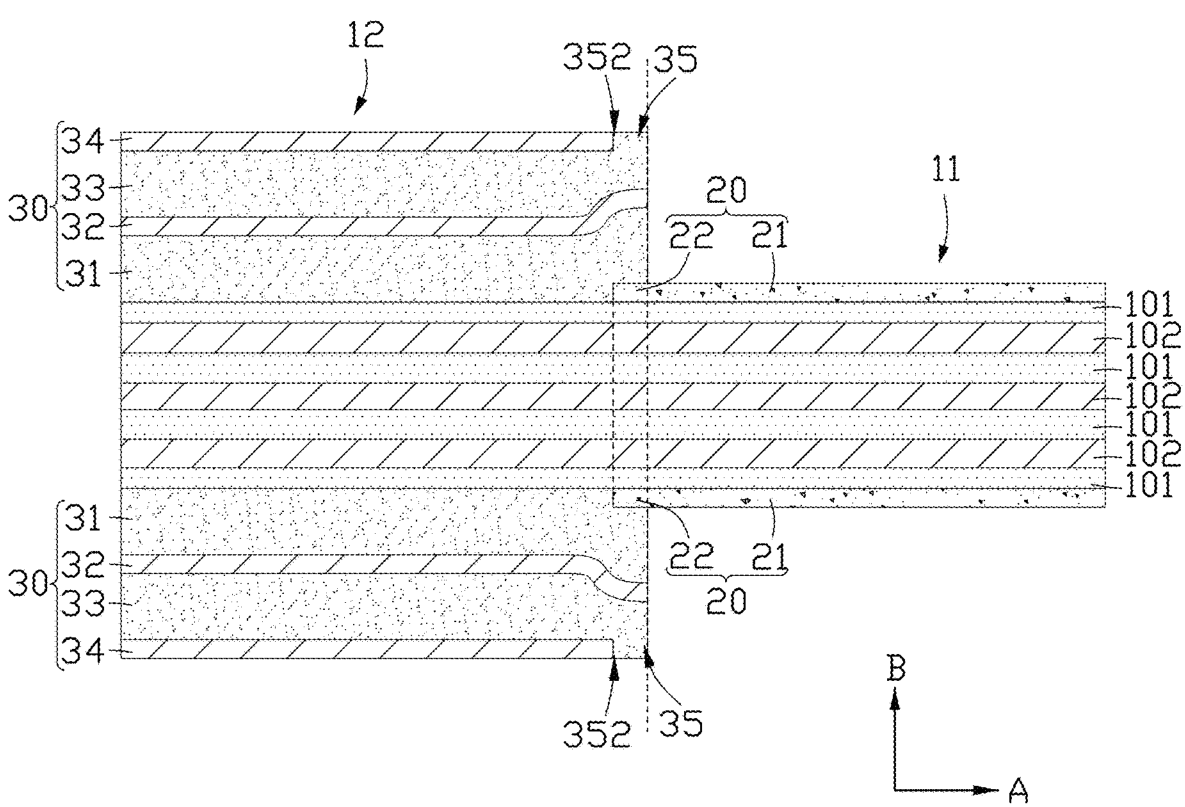
FIG. 8 is a cross-sectional view showing the rigid board being laminated on the flexible board of FIG. 7.

In another embodiment, referring to FIG. 8, after laminating the rigid board 30 and the flexible board 10, the first insulating layer 31 and the first conductive layer 32 are bent upward in the thickness direction B. Since the first conductive layer 32 is bent upward, the second insulating layer 33 is also bent upward and filled into the second notch 352, thereby reducing the warping and deformation on the outer surface of the rigid board 30.

Figure 9:
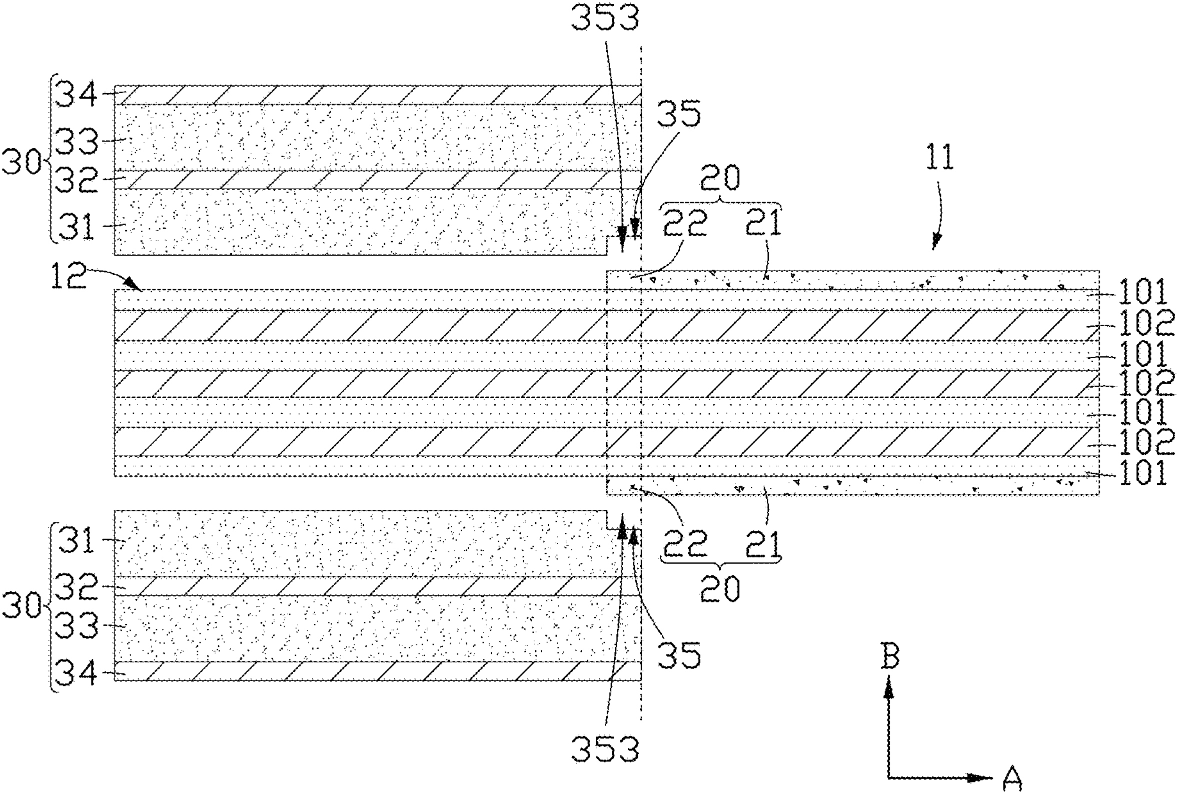
FIG. 9 is a cross-sectional view showing a rigid board being formed on the flexible board according to yet another embodiment of the present application.

In yet another embodiment of the present application, referring to FIG. 9, the notch 35 includes a third notch 353 defined at the first insulating layer 31. The third notch 353 does not extend through the first insulating layer 31 in the thickness direction B. Each of the rigid boards 30 is provided with the third notch 353 in the first insulating layer 31.

Figure 10:
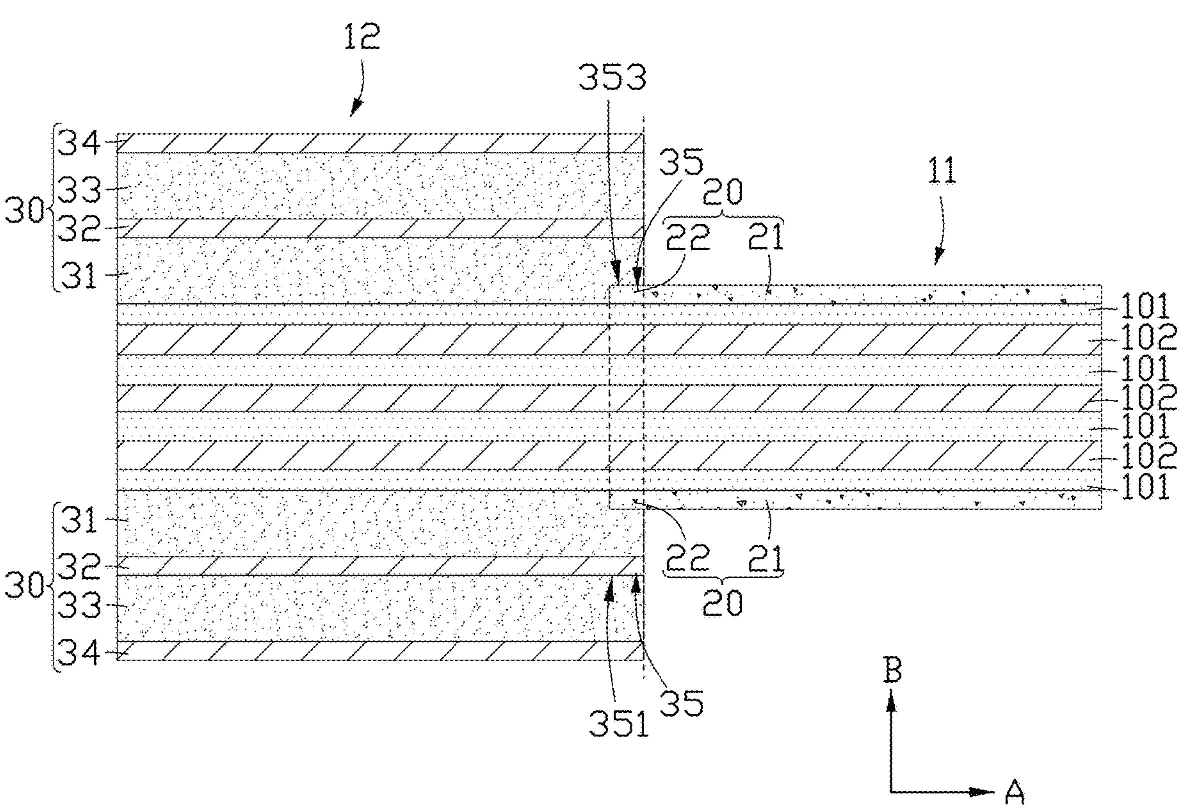
FIG. 10 is a cross-sectional view showing the rigid board being laminated on the flexible board of FIG. 9.

In yet another embodiment, referring to FIG. 10, after laminating the rigid board 30 and the flexible board 10, a portion of the second insulating layer 33 is filled into the third notch 353, thereby reducing the warping and deformation on an outer surface of the rigid board 30.

During the lamination process of the rigid board 30 and the flexible board 10, a portion of the rigid board 30 corresponding to the second portion 22, may be bent in the thickness direction B and filled in the notch 35, thereby reducing the deformation happened on the surface of the rigid board 30 and improving the flatness after lamination. If the rigid board 30 does not have the notch 35, the portion of the rigid board 30 corresponding to the second portion 22 will protrude in the thickness direction B relative to other portions of the rigid board 30 and affecting the flatness of the outer surface of the rigid board 30.

Figure 6:
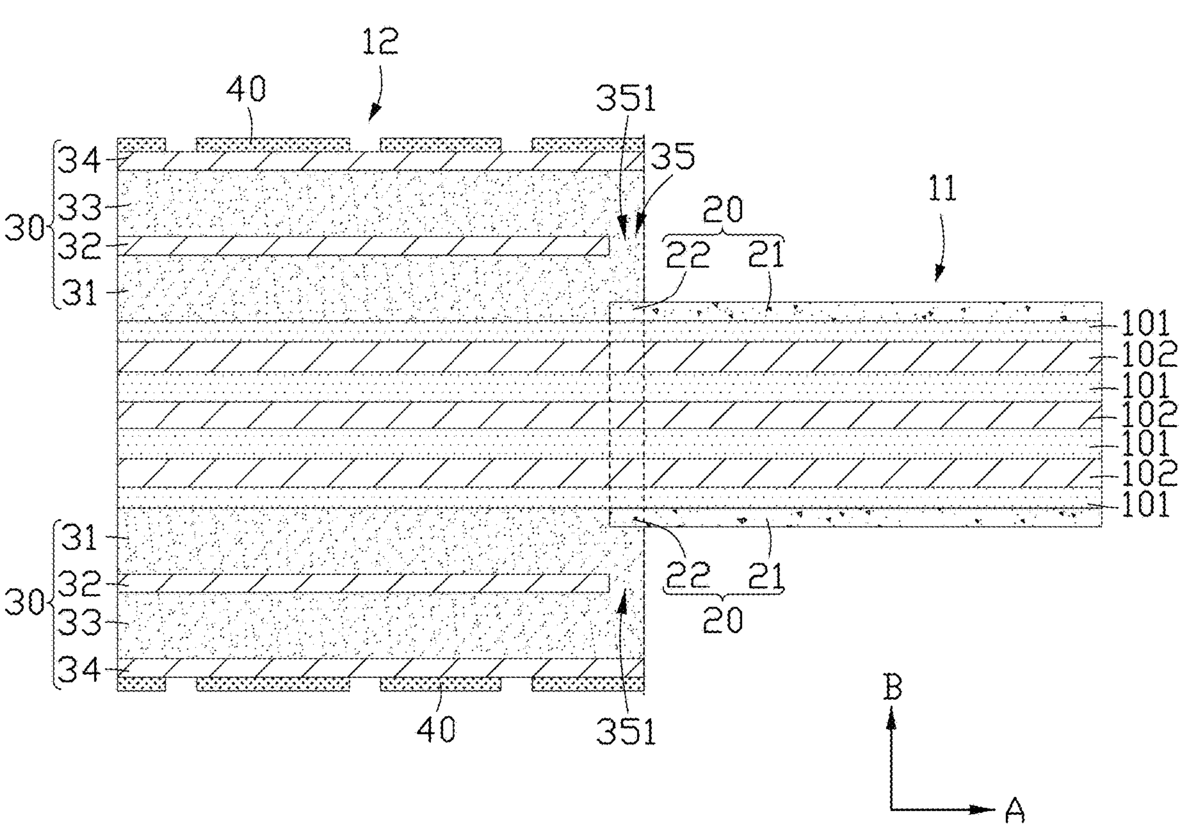
FIG. 6 is a cross-sectional view showing a second protective layer being formed on the rigid board of FIG. 5.

In the first embodiment of the present application, the preparation method further includes:

Block S5, referring to FIG. 6, a second protective layer 40 is formed on a side of the rigid board 30 opposite the flexible board 10. The second protective layer 40 is formed on the second conductive layer 34. The second protective layer 40 is made of resin selected from epoxy resins, polyimide, or liquid photo-imageable (LPI). The second protective layer 40 is used to protect the second conductive layer 34 of the rigid board 30 from oxidation and prevent short circuits during soldering. Additionally, the second protective layer 40 also provides electrical insulation function.

Referring to FIG. 6, a rigid-flexible PCB 100 is provided according to an embodiment of the present application. The rigid-flexible PCB 100 includes a flexible board 10, a first protective layer 20, and a rigid board 30. The flexible board 10 defines an extension direction A. The flexible board 10 is divided into a first region 11 and a second region 12 connected to the first region 11 along the extension direction A. The first protective layer 20 includes a first portion 21 and a second portion 22 connected to the first portion 21. The first portion 21 covers the first region 11, and the second portion 22 partially covers the second region 12. The rigid board 30 is formed in the second region 12 and defines a notch 35 corresponding to the second portion 22. The notch 35 is used to reduce the height difference caused by the second portion 22, making the portion of the rigid board 30 corresponding to the second portion 22 flush with the other portions of the rigid board 30. The rigid board 30 includes a first insulating layer 31, a first conductive layer 32, a second insulating layer 33, and a second conductive layer 34. The first insulating layer 31, the first conductive layer 32, the second insulating layer 33, and the second conductive layer 34 are successively stacked in the thickness direction B. In this embodiment, the notch 35 includes the first notch 351 formed at an end of the first conductive layer 32 and corresponding to the second portion 22. A portion of the first insulating layer 31 and/or a portion of the second insulating layer 33 are filled into the first notch 351.

The first notch 351 is defined in the rigid board 30 to accommodate the second portion 22 of the first protective layer 20, which reduces the height difference caused by the second portion 22. Thus, the surface of the rigid board 30 remains flat. Meanwhile, by integrating the first protective layer 20 with the flexible board 10 and the rigid board 30, the risks of delamination happened on the rigid-flexible PCB 100 is reduced. Meanwhile, the first protective layer 20 can protect a circuitry of the flexible board 10 from environmental and mechanical stresses (e.g., moisture, thermal expansion).

Referring to FIG. 8, in another embodiment of the present application, the notch 35 includes the second notch 352 defined at an end of the second conductive layer 34 and corresponding to the second portion 22. A portion of the second insulating layer 33 is filled into the second notch 352. The first conductive layer 32 and the first insulating layer 31 are bent upward in the thickness direction B. The second notch 352 will not affect the integrity of the first conductive layer 32.

Referring to FIG. 10, in yet another embodiment of present application, the notch 35 includes the third notch 353 defined at an end of the first insulating layer 31 corresponding to the second portion 22, with a portion of the first insulating layer 31 being filled into the third notch 353. The third notch 353 will not affect the integrity of the first conductive layer 32.

Even though h information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A preparation method for a rigid-flexible printed circuit board, comprising:

providing a flexible board having an extension direction, dividing the flexible board into a first region and a second region connected to the first region in the extension direction;

forming a first protective layer on the flexible board, defining a first portion and a second portion on the first protective layer, connecting each of the first portion and the second portion to the first portion, covering the first region with the first portion, covering a portion of the second region with the second portion;

forming a rigid board on the second region, defining a notch corresponding to the second portion on the rigid board; and laminating the rigid board and the flexible board, wherein the rigid board is partially filled into the notch, making a portion of the rigid board corresponding to the second portion flush with other portions of the rigid board.

2. The method of claim 1, wherein forming the rigid board further comprises: stacking a first insulating layer, a first conductive layer, a second insulating layer, and a second conductive layer, successively in above sequence.

3. The method of claim 2, wherein the notch comprises a first notch, forming the rigid board in the second region further comprises: forming the first notch at an end of the second conductive layer corresponding to the second portion; and laminating the rigid board and the flexible board comprises: filling a portion of the second insulating layer into the first notch.

4. The method of claim 2, wherein the notch comprises a second notch, the step of "forming a rigid board in the second region" comprises: forming the second notch at an end of the first conductive layer corresponding to the second portion;

wherein the step of "laminating the rigid board and the flexible board" comprises: filling a portion of the first insulating layer and/or a portion of the second insulating layer into the second notch, causing the first conductive layer to be bent towards the second notch.

5. The method of claim 2, wherein the notch comprises a third notch, forming the rigid board in the second region comprises: forming the third notch at an end of the first insulating layer corresponding to the second portion; and laminating the rigid board and the flexible board comprises: filling a portion of the first insulating layer into the third notch.

6. The method of claim 1, further comprising:

forming a second protective layer on a side of the rigid board opposite the flexible board.

7. A rigid-flexible printed circuit board, comprising:

a flexible board extended in an extension direction, wherein the flexible board is divided into a first region and a second region connected to the first region;

a first protective layer formed on the flexible board, wherein the first protective layer comprises a first portion and a second portion connected to the first portion, the first portion covers the first region, the second portion covers a portion of the second region;

a rigid board formed on the second region, wherein the rigid board defines a notch corresponding to the second portion, and a portion of rigid board is filled into the notch.

8. The rigid-flexible printed circuit board of claim 7, wherein the flexible board comprises a plurality of internal conductive layers and a plurality of internal insulating layers, and each of the plurality of internal conductive layers is disposed between two adjacent of the plurality of internal insulating layers.

9. The rigid-flexible printed circuit board of claim 8, wherein the plurality of internal insulating layers is made of a resin selected from polyimide, polyester, or polytetrafluoroethylene, and the rigid board is a fiberglass epoxy resin board, a polytetrafluoroethylene board, or a ceramic substrate.

10. The rigid-flexible printed circuit board of claim 8, wherein the rigid board comprises a first insulating layer, a first conductive layer, a second insulating layer, and a second conductive layer, the first insulating layer, the first conductive layer, the second insulating layer, and the second conductive layer are successively stacked.

11. The rigid-flexible printed circuit board of claim 10, wherein the notch comprises a first notch, the first notch is formed at an end of the second conductive layer.

12. The rigid-flexible printed circuit board of claim 11, wherein at least one of the first insulating layer and the second insulating layer is filled into the first notch.

13. The rigid-flexible printed circuit board of claim 10, wherein the notch comprises a second notch, and the second notch is formed at an end of the first conductive layer.

14. The rigid-flexible printed circuit board of claim 12, wherein a portion of the first insulating layer is bent towards the first conduct layer, and a portion of the first insulating layer is filled into the second notch.

15. The rigid-flexible printed circuit board of claim 10, wherein the notch comprises a third notch, and the third notch is formed at an end of the first insulating layer.

16. The rigid-flexible printed circuit board of claim 15, wherein a portion of the first protective layer is filled into the third notch.

17. The rigid-flexible printed circuit board of claim 10, further comprising a second protective layer, wherein the second protective layer is connected to a surface of the second conductive layer opposite to the first protective layer.

18. The rigid-flexible printed circuit board of claim 10, wherein the flexible board is made of a resin selected from polyimide, polyester, or polytetrafluoroethylene, and the rigid board is a fiberglass epoxy resin board, a polytetrafluoroethylene board, or a ceramic substrate.

* * * * *